United States Patent [19]

Perrino

[11] 3,868,724

[45] Feb. 25, 1975

[54] MULTI-LAYER CONNECTING STRUCTURES FOR PACKAGING SEMICONDUCTOR DEVICES MOUNTED ON A FLEXIBLE CARRIER

[75] Inventor: Frank A. Perrino, Sunnyvale, Calif.

[73] Assignee: Fairchild Camera and Instrument Corporation, Mountain View, Calif.

[22] Filed: Nov. 21, 1973

[21] Appl. No.: 417,999

[52] U.S. Cl. .......................... 357/65, 357/68, 357/70, 357/71, 357/80, 174/525

[51] Int. Cl. .......................... H01l 3/00, H01l 5/00

[58] Field of Search .......... 317/234, 4, 4.1, 5, 5.4; 174/525

[56] References Cited

UNITED STATES PATENTS

| | | | |
|---|---|---|---|
| 3,544,857 | 12/1970 | Byrne et al. | 317/234 R |
| 3,596,228 | 7/1971 | Reed | 317/234 N |
| 3,662,230 | 5/1972 | Redwantz | 317/234 N |
| 3,683,105 | 8/1972 | Shamash et al. | 317/234 G |
| 3,724,068 | 4/1973 | Galli | 317/234 G |
| 3,781,596 | 12/1973 | Galli et al. | 317/234 G |

OTHER PUBLICATIONS

Film plays supporting role in automating IC assembly, by S. E. Scrupski, Electronics, Feb. 1, 1971, pages 43 to 48.

*Primary Examiner*—Andrew J. James
*Attorney, Agent, or Firm*—Alan H. MacPherson; J. Ronald Richbourg

[57] ABSTRACT

Connecting structures for integrated circuit chips or dice are fabricated by forming a plurality of sets of leads on a first surface of a flexible tape. The sets of leads penetrate through to the second surface of the tape at ends of the leads, via holes formed in the tape. Small contacts are formed to extend beyond the second surface of the tape at the points where the leads penetrate through the tape. The contacts formed at a first end of each of the leads are arranged in a pattern which aligns with corresponding contacts on the integrated circuit chip. The chips are then bonded to the contacts formed at the first ends of the leads, and the chips are subsequently enclosed by a suitable encapsulant such as epoxy. The contacts formed at second ends of the leads are arranged in a pattern which is larger than the pattern of contacts at the first end of the leads, and are disposed for connection to external circuitry.

6 Claims, 8 Drawing Figures

MULTI-LAYER CONNECTING STRUCTURES FOR PACKAGING SEMICONDUCTOR DEVICES MOUNTED ON A FLEXIBLE CARRIER

BACKGROUND OF THE INVENTION

1. Field of the Invention

This invention relates to the semiconductor packaging art, and more particularly to the packaging of semiconductor dice or chips.

2. Description of the Prior Art

Developments in the semiconductor art with respect to large scale integration (LSI) chips have created a problem of packaging these chips, which have very small dimensions. An LSI circuit chip can have numerous electrical contacts which need to be connected to external leads supported by the package which encapsulates the integrated circuit chip. Due to the extremely small size of the integrated circuit chip, a plurality of extremely small wires must be bonded between the numerous contacts of the chip and the external package leads. In order to make these connections in accordance with one technique, each wire is manually bonded. This operation is very tedious and time consuming, thereby making the mass production of encapsulated LSI chips a costly operation. Also, these very small wires are fragile and are easily broken during various manipulations on a mass production assembly line.

Another known prior art technique is disclosed in U.S. Pat. No. 3,689,991 entitled "Method of Manufacturing a Semiconductor Device Utilizing a Flexible Carrier", which issued to Alanson D. Aird on Sept. 12, 1972. This technique employs a pre-apertured tape of a flexible electrically insulating material, having formed thereon a plurality of sets of electrical metallic leads with the inner portions of the leads of each set extending inward and cantilever-wise past the periphery of an adjacent aperture in the tape. The inner ends of the leads in each set of leads are dimensioned and arranged so as to be registerable with respective metallic contacts on an integrated circuit chip. Successive integrated circuit chips, which have previously been produced, are then positioned relative to the tape so that the metallic contacts on the chips and the inner ends of the leads of successive sets of leads are in registery. Then, simultaneous soldering or otherwise joining of the registered lead ends and chip contacts assembles the chips to the tape. The integrated circuit chip may be enclosed in a suitable encapsulant after bonding its contacts to leads on the tape.

A primary disadvantage of this technique is that the loose and fragile leads extending over the aperture in the tape may be bent in handling the tape. Also, the edge of the die may short adjacent leads on the tape by contacting these leads through the aperture, and the registration of the metal pattern to the tape aperture presents a problem.

SUMMARY OF THE INVENTION

In accordance with this invention, a connecting structure for semiconductor devices comprises an insulating tape having formed on a first surface thereof a plurality of sets of conductors, portions of which penetrate the tape through holes formed in a predefined pattern. Electrical contacts are formed in the holes such that an electrical connection can be made to the conductors, by means of the contacts, from an object adjacent to the second surface of the tape.

The structure is fabricated by the method of forming a plurality of holes in a predefined pattern in the insulating tape, and forming the plurality of conductors on one surface of the tape such that a portion of each conductor is formed over one or more of the holes. An electrical conducting material is formed within the holes in the tape for making ohmic contact with the conductors. This material extends beyond the second surface of the tape and constitutes the electrical contacts in one embodiment.

In accordance with one embodiment, a first group of the contacts are arranged in a pattern which corresponds to contacts formed on an integrated circuit chip; a second group of the contacts are arranged in a pattern for making electrical connections with external circuitry; and the conductors on the first surface of the tape form electrical connections between the first group of contacts and the second group of contacts. Alternatively, the second group of contacts may be formed on the top surface of the conductors for connection to external circuitry, or they may be omitted where electrical connections may be made directly to the conductors.

The contacts on the integrated circuit chips are aligned with the first group of contacts on the tape, and these contacts are subsequently bonded together. An encapsulant is then formed around the chip and adjacent portions of the tape for completely housing the chip. After the encapsulant is cured, the encapsulated chip and the connecting structure is cut from the tape leaving a sufficient length of the conductors extending beyond the encapsulated chip for connection to the external circuitry.

One advantage of this invention over the prior art is that the integrated circuit chip is insulated from the conductors by the tape. The contacts on the tape are substantially the same size as the contacts on the integrated circuit chip, and the respective contacts correspond on a one-to-one ratio.

Another advantage, when using transparent tape, is that the contacts on the tape can be visually aligned with the contacts on the integrated circuit chip; which provides for a rapid and relatively simple assembly operation.

Other advantages of the present invention will be apparent from the description below.

IN THE DRAWINGS

FIG. 1 is a planar view of the first surface of the insulating tape having electrical conductors and contacts formed thereon in accordance with the principles of this invention;

FIGS. 2*a*–2*d* show a cross-section of the insulating tape during various stages of the process for forming the electrical conductors and contacts;

DETAILED DESCRIPTION

Figure 1:
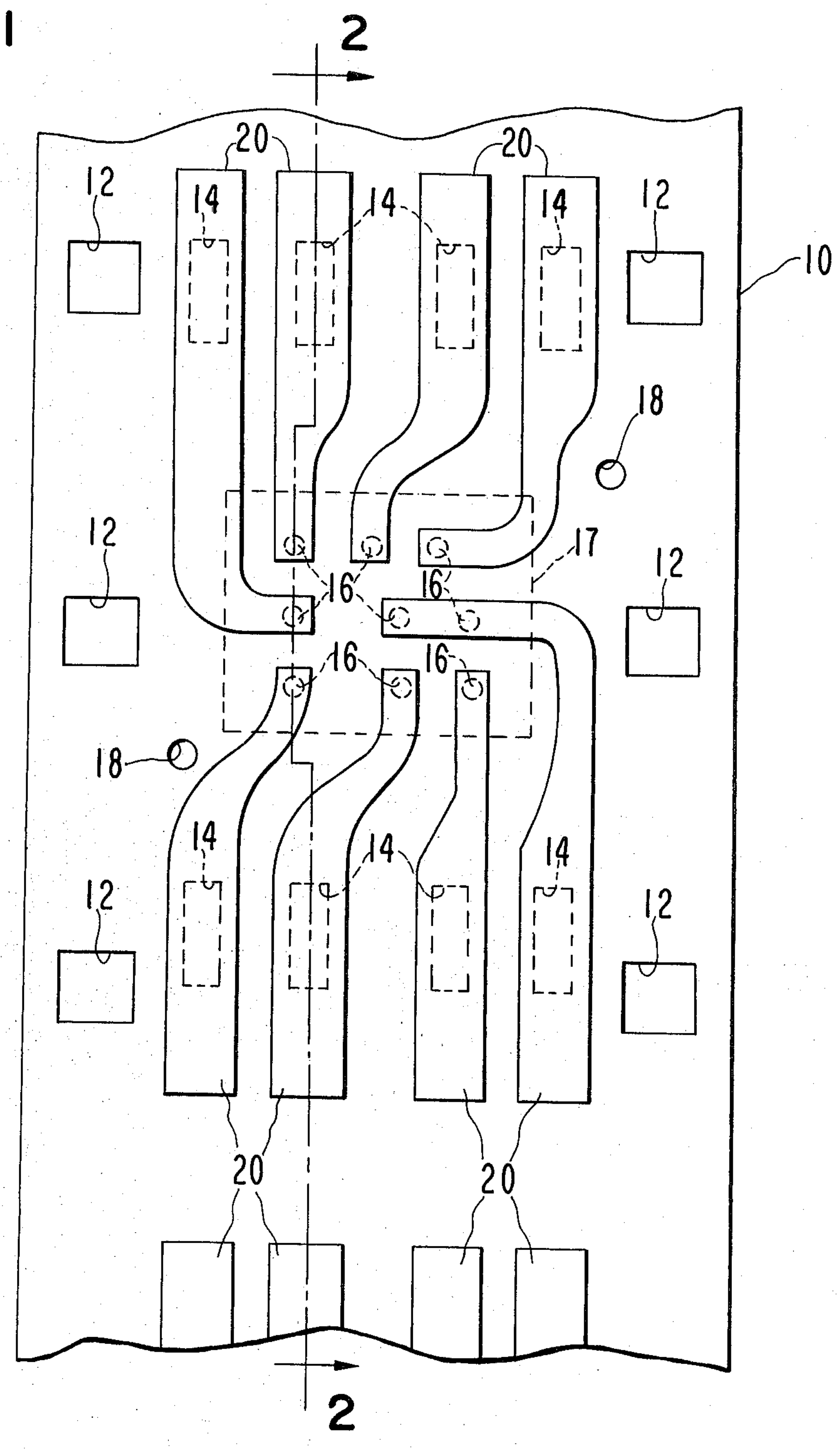

Referring now to FIG. 1, reference numeral 10 designates a portion of a tape constructed from an insulating material, such as the organic resin polyimide, which is flexible and transparent. However, other suitable insulating materials having similar characteristics of transparency, durability, and flexibility may be used for the tape. The insulating material must be able to withstand temperatures which are normally used in packaging integrated circuit devices; and must be sufficiently durable to withstand the exposure to etching and cleaning solutions used in these packaging processes.

In accordance with one embodiment an insulating tape of substantially uniform thickness within the range of 0.0005 to 0.005 inches thick was found satisfactory. The tape used in one process was exposed to temperatures of 160°C, with intermittent exposures of 450° C for approximately two seconds per exposure. An insulating material which was found suitable for use as tape 10, is commercially known as Kapton type H; and is available from the DuPont Company, Wilmington, Delaware.

A plurality of equally spaced apertures 12, formed along each edge of the tape, are employed for indexing the tape during various stages of fabrication and process steps of bonding integrated circuit chips to the tape 10. A second and third plurality of holes 14 and 16 are also formed in the tape 10, which holes allow penetration of metallic conductors through the tape to the second side thereof as will be described further hereafter.

Holes 18 are formed in the tape 10 for use in registration of the assembled package to a connecting substrate, or printed circuit board. Holes 12, 14, 16, and 18 may be formed in tape 10 by either punching or etching, or combinations of both techniques.

A set of electrical conductors 20 are formed over the top surface of the tape 10 in a predefined pattern. Additional identical sets are formed repetitively along the surface of the tape. Conductors 20 may be formed from a sheet of a suitable electrical conducting material; for example, copper. In accordance with one embodiment, the sheet of conducting material has a thickness of from 0.5 mils to 3.0 mils.

Referring now to FIGS. *2a–2d*, which are a series of views of a crosssection of the tape 10 taken along the section line 2–2 (as shown in FIG. 1). This series of views depicts various stages of fabrication, or steps, of the method of this invention. For simplification of the description and figures, only a portion of the crosssection along section line 2–2 is illustrated.

The first step is the formation of holes in the tape 10, such as holes 14 and 16 shown in FIG. *2a*.

The second step, as shown in FIG. *2b*, is to bond a sheet of metallic conducting material 21, such as copper, to surface 10*a* of tape 10 by any suitable means, such as adhesive lamination. The adhesive material must be durable to the same processing exposures as stated above for the tape 10. Also, the conducting material 21 may be electroplated onto the tape 10. Dashed line 21*a* represents the bottom surface of the material 21.

After the conducting material 21 is bonded to the tape 10, the third step is to apply a protective coating (such as wax, varnish, or a photoresist) to the top surface of metallic conducting material 21. A wellknown photoresist material suitable for use herein is KMER, consisting of low molecular weight polyisoprenes plus aromatic diazido compounds dissolved in xylene. See pages 445 to 451 of the book by Barry, Hall and Harris entitled "Thin Film Technology" published by D. Van Nostrand Company, Inc. 1968. Other photoresist materials such as AZ1350H can also be used if necessary.

The fourth step is to electroplate an electrical conducting material 22 to the surface 21*a* of material 21. The protective coating applied in step three prevents the adherence of material 22 to the top surface of material 21. In accordance with one embodiment, material 22 comprises copper; however, other materials having similar characteristics may be used. Material 22 is added to build up portions of the conductors exposed by the holes 14 and 16. As shown in FIG. *2b*, the additional material 22 is formed to a thickness approximately equal to one-half the thickness of the tape 10. That is, the holes 14 and 16 are partially filled with material 22.

Step five comprises the removal of the protective coating applied in step three above.

Step six comprises the application of a protective coating to surface 10b of the tape 10, to protect this surface during a subsequent etching step.

Step seven comprises the application of photoresist to the top surface of material 21, and exposing the photoresist with a masking pattern which defines the pattern of conductors 20. The photoresist materials stated above are suitable for this operation. Subsequently, the photoresist is developed.

Steps six and seven may be combined by applying the photoresist material to all exposed surfaces of the tape structure at this juncture of the process (FIG. *2b*). That is, the photoresist material is suitable for protecting surface 10*b* and material 22 from an etching solution.

The eighth step comprises the application of an etchant to remove portions of the material 21 as defined by the masking pattern of the photoresist material which was exposed and developed in step seven. The portions of the material 21 remaining after this etching step constitute the conductors 20.

The ninth step comprises the removal of the protective coating and the photoresist material applied in steps six and seven, and the removal of copper oxide from the top surface of the material 21 when copper is used for material 21, and from material 22 if necessary.

Step ten comprises the formation of an additional electrical conducting material 23, as shown in FIG. *2c*, over the exposed surfaces of material 21 and 22 by means of an electroless plating process. The electroless plating process comprises immersing the tape 10 into a suitable plating material which will adhere to materials 21 and 22. The material 23 may comprise, for example, tin which is both conductive and solderable. In accordance with one embodiment, material 23 is plated onto the material 21 and 22 to a thickness within the range of 50 to 100 microinches. The material 23 also performs the function of preventing the exposed surfaces of the material 21 from oxidizing, as well as the material 22.

Figure 2A:
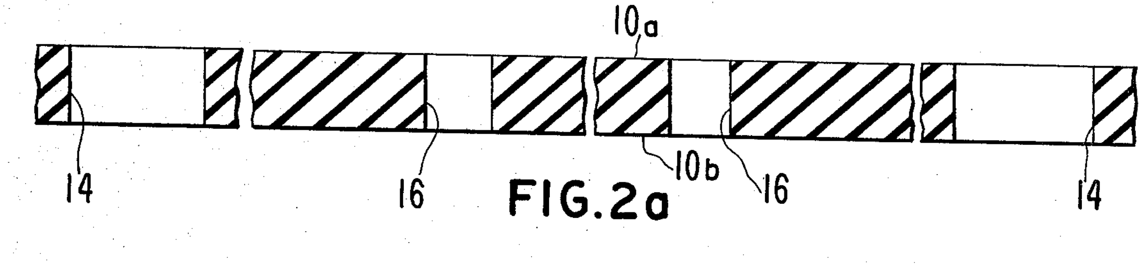
Figure 2B:
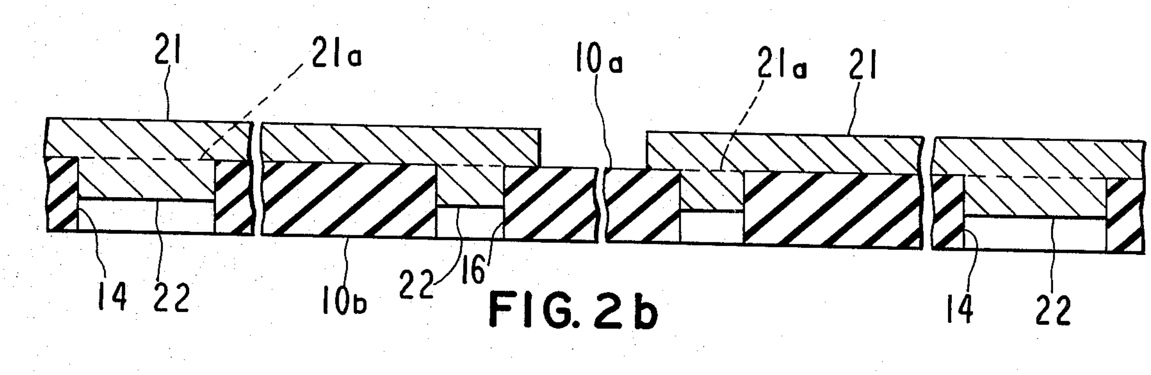
Figure 2C:
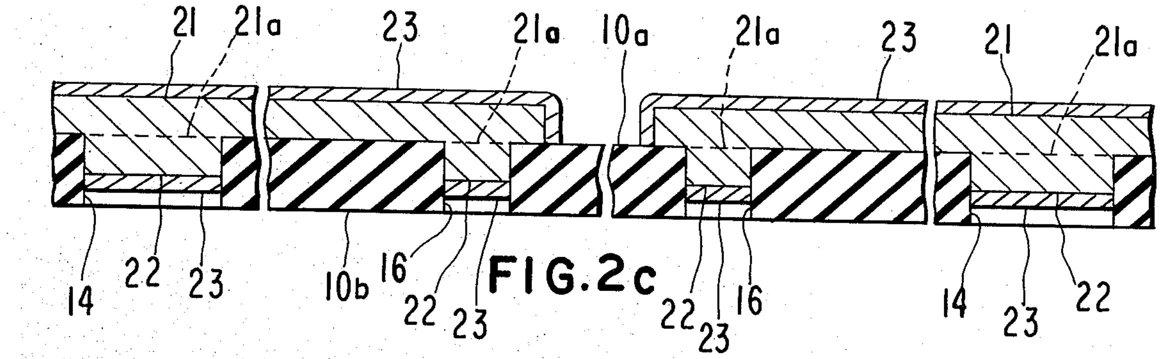
Figure 2D:
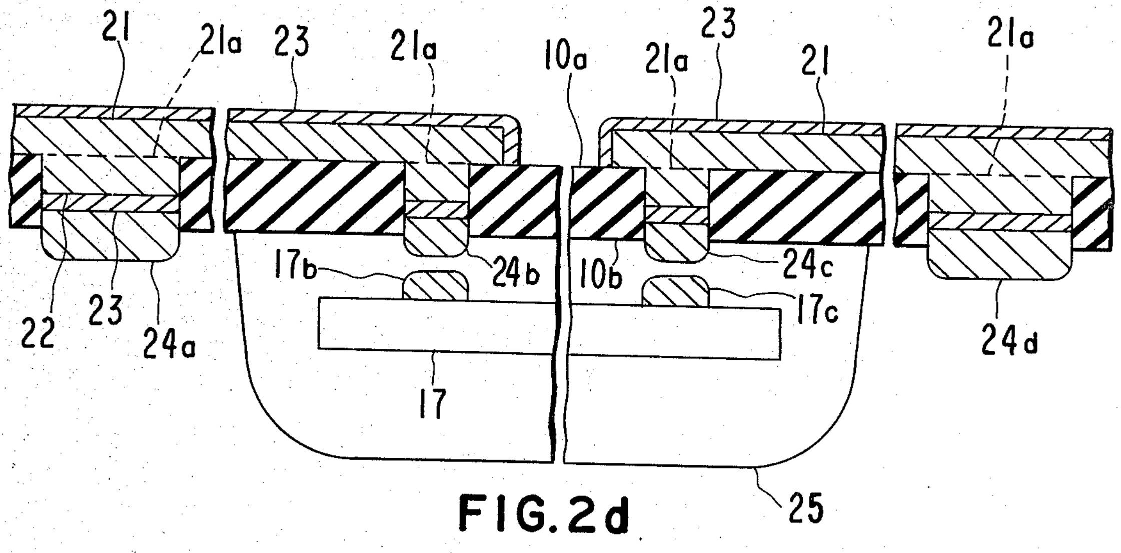

Step eleven comprises the formation of a metallic material 24, for example, a combination of gold and tin, over the exposed portions of material 23 located within holes 14 and 16. The material 24 may be formed onto the material 23 by means of soldering. If soldering is employed, then a flux material should be applied to the material 23 prior to the step eleven. The material 24 constitutes the electrical contacts which, in accordance with one embodiment, extend from surface 10*b* of the tape 10 as shown in FIG. 2*d*.

It is also possible to either form the contacts 24 flush with surface 10*b* of the tape 10 or to recess the contacts within the holes 14 and 16. The contacts 24 provide a means for electrically connecting the conductors 20 to an object, such as an integrated circuit chip, adjacent to surface 10*b* of the tape 10. In particular, contact 24*b* is electrically connected to contact 24*a* by means of electrical conducting materials 21, 22, and 23. Likewise, contact 24*c* is electrically connected to contact 24*d*.

At this stage of the process, tape 10, with the associated electrical conductors and contacts formed thereon, is ready for bonding to integrated circuit chips.

Electrical contacts 17*b* and 17*c*, extending from integrated circuit chip 17, are dimensioned and arranged for making electrical connection with contacts 24*b* and 24*c*, respectively.

Step twelve comprises the urging of integrated circuit chip 17 to tape 10 with an accompanying application of heat to thereby bond contacts 17*b* and 17*c* to contacts 24*b* and 24*c*, respectively. In accordance with one embodiment, heat is applied in step twelve at approximately 300° C for 0.5 to 2 seconds. Holes 12 in the tape 10 may be employed for indexing the tape and aligning the integrated circuit chip to the contacts extending from the surface 10*b* prior to the bonding step twelve.

The thirteenth step is to apply an encapsulant, such as epoxy, plastic, glass, or the like, to either one or both sides of the tape 10 for sufficiently covering the integrated circuit chip 17.

Once the encapsulant is formed to cover the chip 17, the fourteenth step is to gel the encapsulant. In accordance with one embodiment, heat is applied in the fourteenth step within the range of 100° C to 175° C for an appropriate period of time, such as ten minutes.

The fifteenth step is to cure the encapsulant by, for example, heating in an oven at approximately 150° C for two hours. Following either the twelfth or the fifteenth step, the bonded integrated circuits may be tested for proper electrical function.

The sixteenth step comprises cutting the integrated circuit chips with the connecting structure, from the tape 10. A sufficient length of the conductors 20 are left with the encapsulated chip, after cutting, for connections to the external circuitry. These remaining lengths of the conductors 20 remain attached to the tape 10, which provides support for the connecting structure of the chip. At this stage of the process, the integrated circuit chip and connecting structure may be readily attached to a printed circuit board or other flexible or non-flexible circuitry, by means of contacts such as 24*a* and 24*d*. However, if the external contacts, such as contacts 24*a* and 24*d*, were not employed; then connections to the external circuitry could be made directly to conductors 20. Holes 18 may be employed for alignment of the assembled package to the substrate, or printed circuit board.

Figure 3:
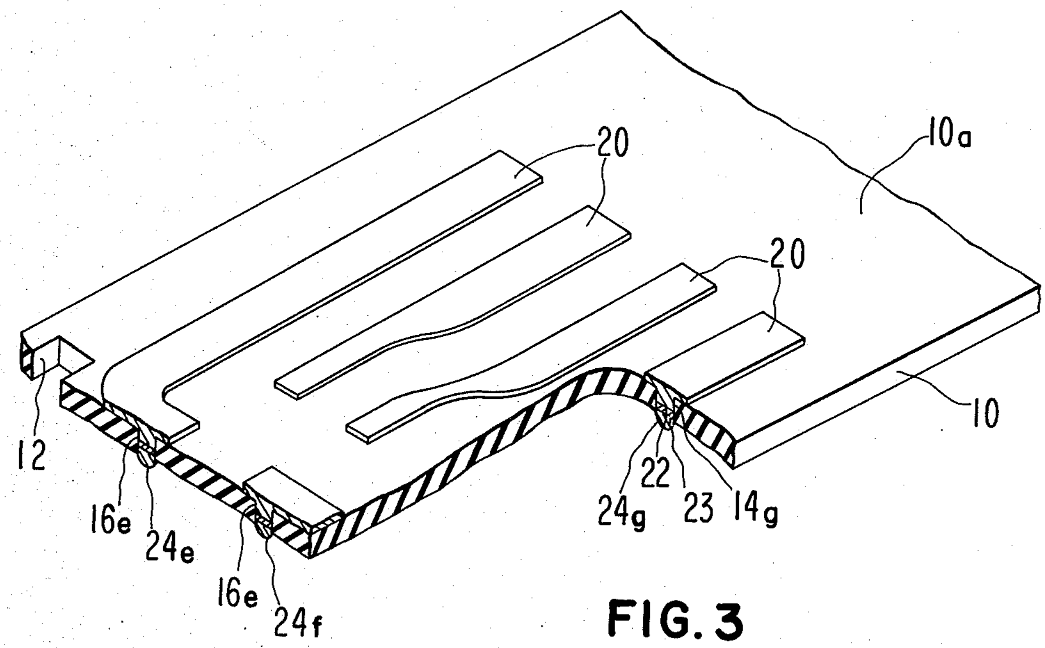
FIG. 3 is an isometric view showing detailed portions of the connecting structure formed on the insulating tape.

Referring now to FIG. 3, an isometric view of the connecting structure formed on the tape 10 is shown with a portion cut away. Conductors 20 are formed on surface 10*a* of tape 10. Metallic electrical conducting materials 22, 23, and 24 are formed within holes 14 and 16 as described above. In particular, conducting material 24 forms contacts 24*e* and 24*f* which are adapted for making electrical connections with corresponding contacts on the integrated circuit chip (not shown in FIG. 3). Likewise, contact 24*g* is formed by soldering metallic material 24 to metallic material 23 within hole 14*g*.

Figure 4:
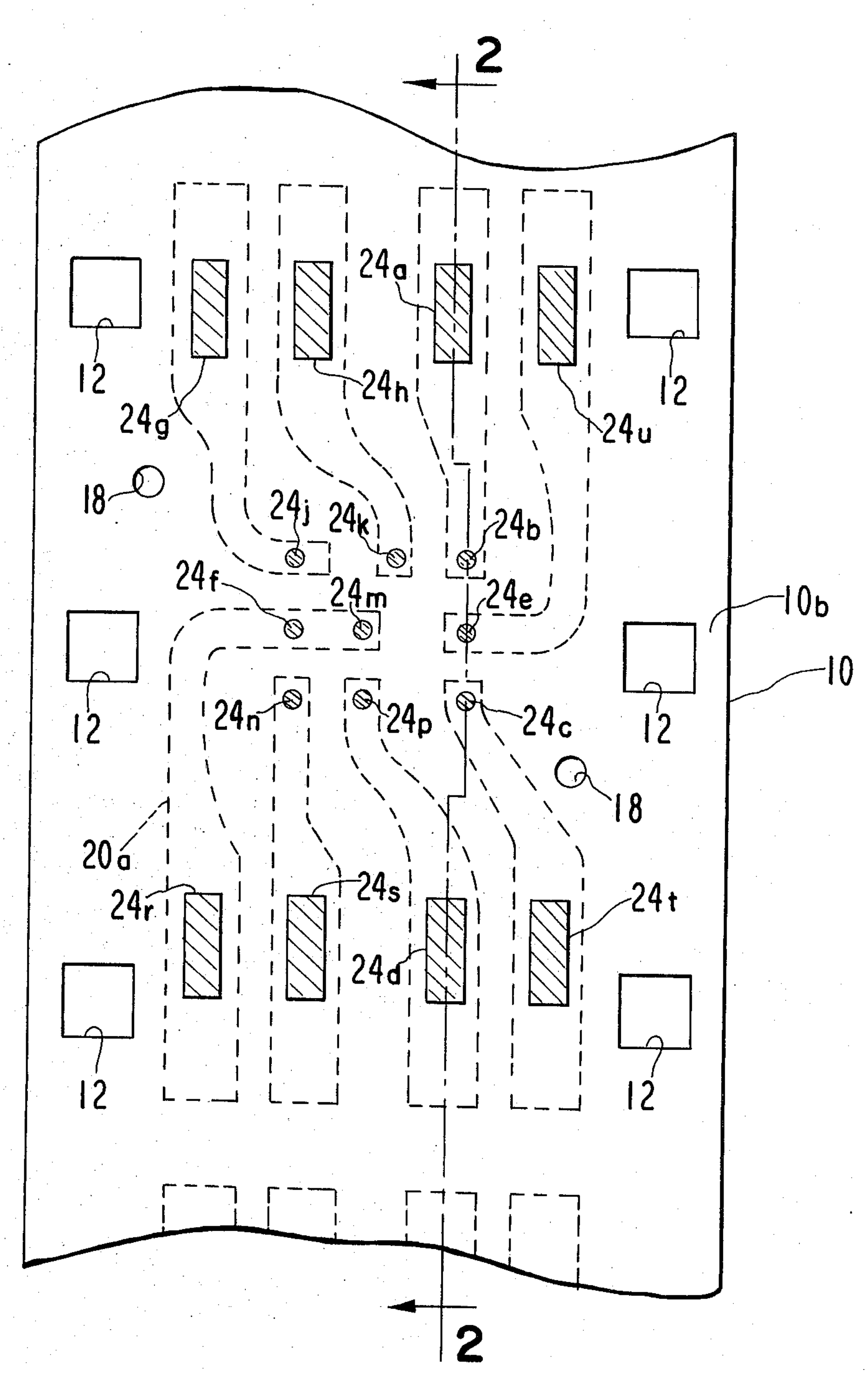
FIG. 4 is a planar view of the second surface of the tape showing the electrical contacts formed for connection to an integrated circuit chip.

Referring now to FIG. 4, the bottom surface 10*b* of tape 10 is illustrated in planar view. Contacts 24*g*, 24*h*, 24*a*, and 24*u*, formed from conducting material 24, are disposed for making electrical connections with external circuitry (not shown). Likewise, contacts 24*r*, 24*s*, 24*d*, and 24*t* are disposed for making electrical connections with the external circuitry. Contacts 24*j*, 24*k*, 24*b*, 24*f*, 24*m*, 24*e*, 24*n*, 24*p*, and 24*c* are disposed for making electrical connections with the integrated circuit chip; and are required for the structure of this invention. However, the contacts disposed for connection to the external circuitry (e.g., 24*g*, 24*h*, 24*a*, 24*u*, 24*r*, 24*s*, 24*d*, and 24*t*) are not necessarily required as shown in the drawings and may be either formed on the opposite side of the conductors 20, or they may be omitted. If these contacts are omitted, then electrical connections to the external circuitry may be made directly with the conductors 20.

The contacts disposed for connection to the integrated circuit chip comprise a first group of contacts, and the contacts disposed for connection to external circuitry comprise a second group of contacts. The first group of contacts are electrically connected to the second group of contacts by means of conductors 20. In particular, and by way of example, contact 24*r* is connected to contacts 24*f* and 24*m* via conductor 20*a*. Even though eight second group contacts and nine first group contacts are illustrated in the figures; it should be understood that any combination of contacts may be constructed by one having skill in the art.

Figure 5:
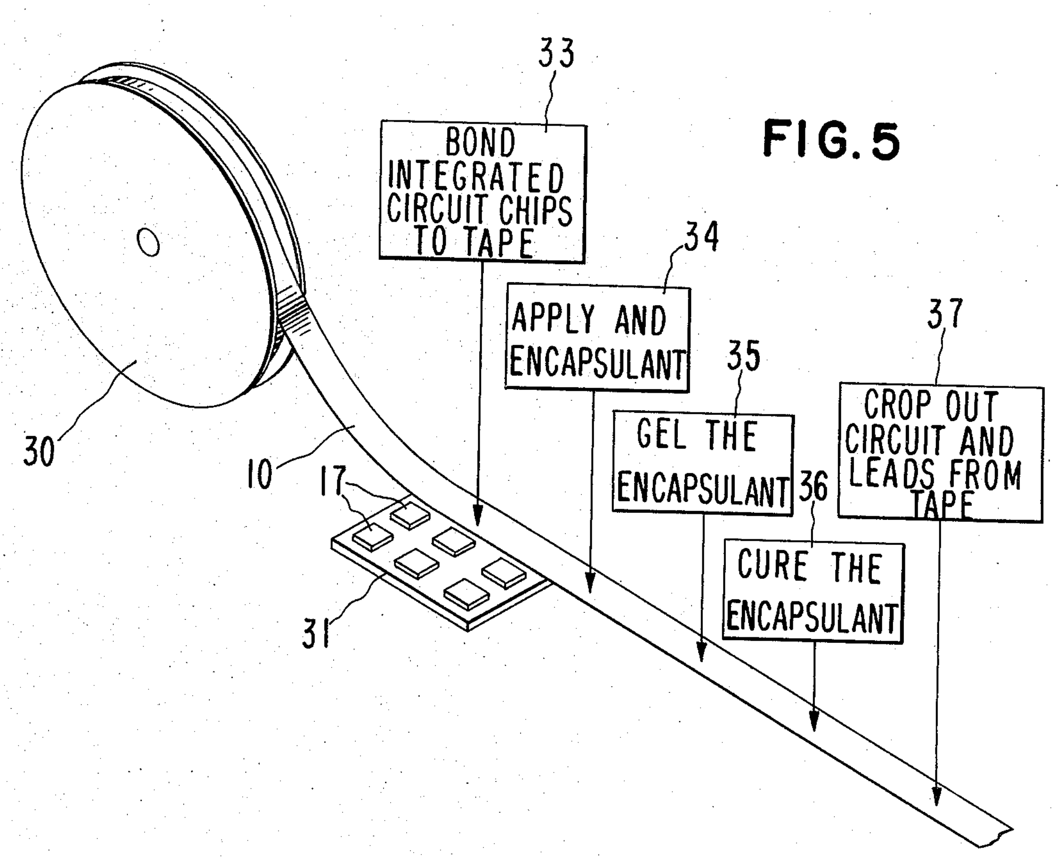
FIG. 5 is a perspective view of the process for packaging integrated circuits on a connecting structure constructed in accordance with this invention.

Referring now to FIG. 5, a reel 30 having coiled thereon a continuous strip of tape 10, which tape contains the connecting structure constructed in accordance with the principles of this invention (as described above), is disposed for assembling integrated circuit chips to corresponding portions of the tape. A plurality of integrated circuit chips 17 are either severed and in wafer form or arranged on a plate 31 to place the chips in a position for bonding to the tape 10. During normal assembly operation, tape 10 is reeled from reel 30 and successive ones of chips 17 are aligned and bonded to successive contacts 24 on the tape.

Steps twelve through sixteen are illustrated diagramatically by blocks 33–37, respectively. When the tape 10 is fabricated in accordance with steps one through eleven as described hereinabove, the tape is disposed on reel 30 for the subsequent steps of the method. As depicted by block 33, the integrated circuit 17 is bonded to the contacts of the connecting structure formed on tape 10. An encapsulant is formed around the circuit 10, as depicted by block 34. The encapsulant, which may comprise epoxy or the like, is gelled and cured as depicted by blocks 35 and 36 respectively. Finally the circuit chips and associated connecting structures are cut from the tape 10 as depicted by block 37. The circuit chip, with associated conductors 20 bonded thereto, may be tested for proper electrical performance either before or after this final step, or after step twelve.

I claim:

1. A connecting structure for semiconductor devices, which comprises:

a. a tape of insulating material having a plurality of holes formed in a predetermined pattern;

b. electrical conductors formed on a first surface of said tape, wherein portions of said conductors cover one or more of said holes thereby to expose said portions of said conductors through said holes; and c. electrical contacts formed through said holes in ohmic contact with said portions of said conductors such that electrical connection can be made to said conductors, by means of said contacts, from an object adjacent the second surface of said tape, and said semiconductor devices are electrically insulated from said electrical conductors by said tape in all areas except adjacent said electrical contacts.

2. Structure which comprises:

a. a semiconductor die containing a plurality of contacts shaped on one surface thereof;

b. an insulating tape over said one surface of said semiconductor die, said insulating tape possessing a plurality of holes, each hole being located directly above a corresponding one of said contacts; and c. a plurality of electrical leads electrically connected on a one-for-one basis to said plurality of contacts, said electrical leads being formed on and adherent to said tape, each lead being in registery with, and overlying a corresponding hole, and an end portion of each lead having a section of conductive material attached thereto and extending through said hole into electrical contact with said corresponding contact on said die, wherein said semiconductor die is electrically insulated from said electrical leads by said insulating tape in all areas except adjacent said contacts.

3. Structure as in claim 2 wherein said insulating tape is not adherent to said top surface of said semiconductor chip but is held in contact therewith by the sections of electrically conductive material interconnecting the end portions of said conductive leads with said contacts.

4. Structure as in claim 3 wherein said conductive leads are formed on, and adherent to said conductive tape.

5. Structure as in claim 2 including package means containing a bottom part and a top part, said semiconductor die being bonded to an adherent portion of said bottom part, said top part being bonded to said bottom part so as to completely surround said semiconductor die thereby to form a closed container within which said chip is contained.

6. Structure as in claim 5 wherein said bottom and said top part of said package comprise epoxy.

* * * * *